(12) United States Patent
Ori

(10) Patent No.: US 6,643,300 B1
(45) Date of Patent: Nov. 4, 2003

(54) LASER IRRADIATION OPTICAL SYSTEM

(75) Inventor: Yuichiro Ori, Moriyama (JP)

(73) Assignee: Minolta Co., Ltd., Osaka (JP)

( * ) Notice: Subject to any disclaimer, the term of this patent is extended or adjusted under 35 U.S.C. 154(b) by 316 days.

(21) Appl. No.: 09/629,762

(22) Filed: Jul. 31, 2000

(30) Foreign Application Priority Data

Aug. 4, 1999 (JP) ............................................ 11-220970

(51) Int. Cl.$^7$ ............................ H01S 3/10; G03B 27/54
(52) U.S. Cl. ........................................... 372/23; 355/67
(58) Field of Search ................... 372/23, 27, 29.014, 372/101; 355/67, 71

(56) References Cited

U.S. PATENT DOCUMENTS

| | | | |
|---|---|---|---|
| 5,574,597 A | | 11/1996 | Kataoka ........................ 359/569 |
| 5,695,274 A | * | 12/1997 | Kamihara et al. ........ 219/121.7 |
| 5,815,222 A | * | 9/1998 | Matshuda et al. ............... 349/1 |
| 5,926,257 A | * | 7/1999 | Mizouchi ...................... 355/67 |
| 6,055,106 A | * | 4/2000 | Grier et al. .................. 359/566 |
| 6,154,433 A | * | 11/2000 | Hoshino et al. ............. 369/112 |
| 6,259,512 B1 | * | 7/2001 | Mizouchi ...................... 355/67 |
| 6,268,904 B1 | * | 7/2001 | Mori et al. .................... 355/53 |
| 6,388,736 B1 | * | 5/2002 | Smith et al. ................... 355/53 |
| 6,416,190 B1 | * | 7/2002 | Grier et al. .................. 359/614 |
| 6,433,303 B1 | * | 8/2002 | Liu et al. .................. 219/121.7 |

FOREIGN PATENT DOCUMENTS

JP 10-197709 A 7/1998

* cited by examiner

Primary Examiner—Paul Ip
Assistant Examiner—Phillip Nguyen
(74) Attorney, Agent, or Firm—Sidley Austin Brown & Wood LLP

(57) ABSTRACT

A laser irradiation optical system includes a dividing means for dividing a first entering laser beam once, and producing a plurality of second laser beams having beam widths equal to the beam which of the first laser beam and advancing in mutually different directions, a condensing means for condensing for condensing each second laser beam to mutually advance in near the same direction; and a shaping means for converting the intensity distribution of a cross section perpendicular to the optical path of each second laser beam in the optical paths of the mutually separated second laser beams.

25 Claims, 8 Drawing Sheets

Fig. 1

LASER IRRADIATION OPTICAL SYSTEM

CROSS REFERENCE TO RELATED APPLICATIONS

The present application is based on Patent Application No. 11-220970 filed in Japan, the content of which is hereby incorporated by reference.

BACKGROUND OF THE INVENTION

1. Field of the Invention

The present invention relates to a laser irradiation optical system, and specifically relates to a laser irradiation optical system which divides a laser beam, shapes each laser beam after division, and emits each laser beam after shaping.

2. Description of the Prior Art

A characteristic of a laser beam is the ability to increase intensity and reduce the beam width, for diversified fine processing of an object surface. In recent years, increased processing efficiency has been achieved by performing the same process at a plurality of parts by dividing a laser beam emitted from a laser light source into a plurality of laser beams, and irradiating an object with the laser beams after division of the laser beam.

It is necessary to equalize the intensity of the laser beams after division because the different parts of the object cannot be processed equally due to differences in intensity between the emitted laser beams. The intensity distribution of each laser beam must be set in accordance with shape of the object being processed because the object is processed in a shape corresponding to the intensity distribution of the laser beam. For example, when forming a hole having a square cross section and a fixed depth in an object, the contour of the cross section perpendicular to the optical path must be rectangular, and the laser beam must have a uniform intensity distribution within this cross section.

Accordingly, the laser irradiation optical system used for such purpose not only simply divides the laser beam emitted from the light source, but also must equalize the intensity of all laser beams after division to attain a desired intensity distribution of each laser beam in a cross section parallel to the optical path and in a cross section perpendicular to the optical path. In general, the intensity distribution in a cross section perpendicular to the optical path of the laser beam emitted from a light source is a Gaussian type distribution, and is not suitable to be used directly in most cases. For this reason, the intensity distribution of the laser beam is converted, i.e., shaped, by the laser irradiation optical system.

The construction of a conventional laser irradiation optical system is briefly shown in FIG. 15. This laser irradiation optical system 7 divides a laser beam L1 emitted from a laser light source 71 into four laser beams L2, and equalizes the intensity distribution of each laser beam L2 in a cross section perpendicular to the optical path. Three half-mirrors 73 are provided to divide the laser beam L1, and the transmittance and reflectivity rate of the three half-mirrors 73 are set so as to equalize the intensity of the laser beams L2 after division. The laser means L2 after division are directed to a light shield 77 provided with openings 77a having identical size and shape and disposed at equal distances via the total reflecting mirror 74. The light shield 77 transmits only the center part of the laser beam L2 having a Gaussian distribution so as to render a uniform intensity distribution in a cross section perpendicular to the optical path, and regulates the shape of the contour of this cross section via the shape of the opening 77a.

A beam expander 72 for broadening the beam width of the laser beam L1 is arranged on the optical path from the light source 71 to the half-mirror 73, and a lens 75 for converging the laser beam L2 on the light shield 77 is arranged on the optical path of each divided laser beam L2. The four lenses 75 have identical performance, and the distance from each lens 75 to the light shield 77 is equal. A reducing optical system 78 is provided on the optical path of the laser beam L2 transmitted through the opening 77a, and each laser beam L2 is condensed in beam width and mutual spacing via the reducing optical system 78 and irradiates the irradiation object surface S.

In laser irradiation device 7, the divided laser beams L2 are shaped by the opening 77a of the light shield 77, the lens 75, and the reducing optical system 78. The main element among the aforesaid elements fulfilling this function is the opening 77a which regulates the intensity distribution in a direction perpendicular to the optical path. The condition of the shaping of the divided laser beam L2 by the opening 77a of the light shield 77 is shown schematically in FIG. 16.

In this laser irradiation device, the division of the laser beam emitted from the light source occurs in several stages. For this reason, the overall structure is enlarged, there are many optical elements, and the relative positions of the elements cannot be easily set. This problem becomes pronounced as more laser beams are produced after division.

The divided laser beams have a Gaussian type distribution similar to the laser beam before division, and the range in which the intensities are near fixed is narrow. Accordingly, the majority of the laser beam is eliminated in shaping, such that there is poor usage efficiency of the laser beam from the light source. In the example of FIG. 16, only one half of the laser emitted from the light source is used.

Laser beam division also can be accomplished by a diffraction element; when such an element is used, the beam can be divided once, and the overall structure can be expected to be made more compact. However, there is no example of use of a diffraction element for division in laser irradiation optical systems which shape the beam after dividing the beam. This is because the laser beams are overlap directly after division, and the shaping of each laser beam is difficult in this state, the direction of travel of each laser beam differs after division, and setting the conditions for managing the direction of travel and the conditions for shaping are difficult.

SUMMARY OF THE INVENTION

An object of the present invention is to improve a compact laser irradiation optical system for dividing and shaping a laser beam into a plurality of laser beams and emitting the laser beams after shaping.

A particular object of the present invention is to provide a laser irradiation optical system which has little loss of the laser when shaping.

These objects are attained by a laser irradiation optical system having the following construction.

A laser irradiation optical system comprising a dividing means for dividing a first entering laser beam once, and producing a plurality of second laser beams having beam widths equal to the beam which of the first laser beam and advancing in mutually different directions; a condensing means for condensing each second laser beam to mutually advance in near the same direction; and a shaping means for converting the intensity distribution of a cross section perpendicular to the optical path of each second laser beam in the optical paths of the mutually separated second laser beams.

The division means divides the entering first laser beam into a plurality of second laser beams, but since this division occurs only once, the overall construction of the laser irradiation optical system is compact. The division means may divide the first laser beams in only one direction, or may divide the first laser beam in two directions. All the second laser beams obtained by division have approximately equal beam widths. Since it is also possible for the division means to approximately equalize the intensities of all the second laser beams, all the second laser beams can be rendered equivalent excluding the different directions of travel.

The second laser beams are set to advance in approximately the same direction via the condensing means. Accordingly, the second laser beams can irradiate the irradiation object from identical directions. Moreover, the condensing means produces a condensed beam of each second laser beam, such that the beam width of each second laser beam can be easily be extremely reduced on the object surface.

Although the second laser beams overlap directly after division, they mutually separate by traveling a certain distance. The condensing means may be disposed on the optical path of the overlapping second laser beams, or may be disposed on the optical path after separation. In the former disposition, the second laser beams are reliably separated so as to advance in mutual parallel because the beam widths are narrowed when the beams are condensed by the condensing means. Furthermore, the position of separation in this instance is rendered nearer to the dividing means than when a condensing means is not used.

Each second laser beam has its intensity distribution converted in a cross section perpendicular to the optical path by the shaping means. That is, the shaping means shapes the second laser beams in a direction perpendicular to the optical path. Since this shaping is accomplished in the optical path in which the second laser beams are mutually separated, the second laser beams can be set in a desired shape easily and reliably.

When the condensing means is disposed at a position at which the second laser beams overlap, the shaping means is disposed in the optical path of the second laser beams that have passed through the condensing means. When the condensing means is disposed at a position at which the second laser beams are separated, the shaping means can be disposed either in the optical path of the second laser beams that have reached the condensing means, or in the optical path of the second laser beams that have passed through the condensing means.

In this laser irradiation optical system, the dividing means is an element which divides a first laser beam by diffraction to produce a second laser beam, and the condensing means is an element having a focal point on or near the dividing means, and arranged in the optical path anterior to the position of mutual separation of the second laser beams, and which satisfies the relationship of equation 1.

$$f \cdot \{1 - m \cdot \lambda \cdot f/(p \cdot W)\} \leq Zd \leq f \cdot \{1 + m \cdot \lambda \cdot f/(p \cdot W)\} \qquad \text{Eq. 1}$$

Where $\lambda$ represents the wavelength of the first and second laser beams, f represents the focal length of the condensing means, m represents the minimum value of the absolute value of the difference of the degree of diffraction of the second laser beams in the same diffraction direction, W represents the beam width of the first laser beam in this diffraction direction, p represents the sequence period of the grating unit of the dividing means in this diffraction direction, and Zd represents the distance from the condensing means to the shaping means with the advancing direction of the second laser beam designated positive.

The left side of equation 1 represents the position at which the two second laser beams having the smallest difference in degree of diffraction are mutually separated as condensed beams by the condensing means; at this position all of the second laser beams are separated. The right side of equation 1 represents the position at which the two second laser beams having the smallest difference in degree of diffraction again overlap as divergent beams after being once condensed; overlap of all the second laser beams occurs after this position.

Accordingly, the shaping means which has a relative position to the condensing means stipulated by equation 1 is reliably positioned in the optical path where the second laser beams are mutually separated. When the disposition of the condensing means is at a position at which the two second laser beams having the smallest difference in degree of diffraction are mutually separated, the left side of equation 1 becomes [0], and when the condensing means is disposed even nearer to the dividing means, the left side of equation 1 becomes a positive value.

The dividing means is an element which divides the first laser beam by diffraction to produce second laser beams, and the condensing means is an element having a focal point on or near the dividing means and arranged in the optical path posterior to the position of mutual separation of the second laser beams, and which satisfies the relationship of equation 2.

$$f \cdot \{p \cdot W/(m \cdot \lambda \cdot f) - 1\} \leq Zd \leq f \cdot \{1 + m \cdot \lambda \cdot f/(p \cdot W)\} \qquad \text{Eq. 2}$$

The definition of the various symbols in equation 2 are the same as described previously. The left side of equation 2 represents the position at which the two second laser beams having the smallest difference in degree of diffraction are mutually separated while maintaining the path after diffraction; at this position all of the second laser beams are separated. The right side of equation 2 represents the position at which the two second laser beams having the smallest difference in degree of diffraction again overlap as divergent beams after once being condensed by the condensing means; the overlap of all the second laser beams occurs after this position.

Accordingly, the shaping means which has a relative position to the condensing means stipulated by equation 2 is reliably positioned in the optical path where the second laser beams are mutually separated. Under the condition that the disposition of the condensing means is at a position at which the two second laser beams having the smallest difference in degree of diffraction are mutually separated, the left side of equation 2 becomes not a value of zero or greater, but a negative value. The fact that Zd is negative means that the shaping means is disposed between the dividing means and the condensing means.

When the dividing means is a diffraction element that divides the first laser beam in one direction, the element generates a unidimensional diffraction, whereas when such an element divides the first laser beam in two directions, the element generates bidimensional diffraction. In the case of bidimensional diffraction, equation 1 or equation 2 obtain for both diffraction directions.

The condensing means and the shaping means may be formed as a single integrated element. Such an element can be near the condensing means and shaping means, i.e., can be used when Zd is approximately equal to [0] on the left side of equation 1, and when Zd of equation 2 is approximately [0].

The shaping means may be a single element having a plurality of parts for converting the intensity distribution of the second laser beams. In this case, the shaping means positioning may easily match the dividing means and the condensing means.

The shaping means may be an element for converting the intensity distribution of the second laser beams by diffraction. The conversion of the intensity distribution by a diffraction element allows great freedom, and the second laser beam can easily achieve a desired shape by the setting sequence of the diffraction grating. Furthermore, no part of the entering laser beam is eliminated, and all parts can be used in the conversion, thereby increasing the laser usage efficiency. A diffraction element used as a shaping means may be a binary type provided with small surfaces at different heights in steps, or may be a free curvature type provided with moderately ranged staged surfaces.

BRIEF DESCRIPTION OF THE DRAWINGS

This and other objects and features of this invention will become clear from the following description, taken in conjunction with the preferred embodiments with reference to the accompanying drawing, in which.

DESCRIPTION OF THE PREFERRED EMBODIMENTS

Figure 1:
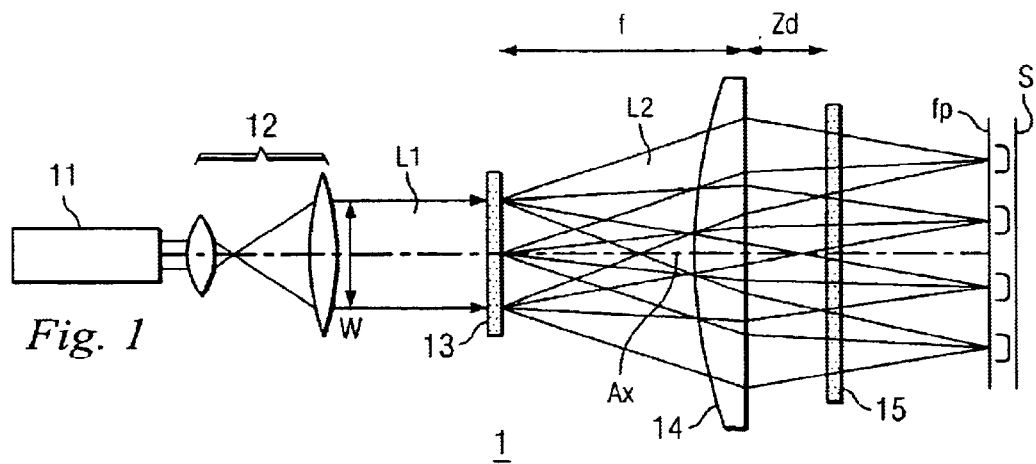
FIG. 1 briefly shows the structure of the laser irradiation optical system of a first embodiment of the present invention.

The embodiments of the laser irradiation optical system of the present invention are described hereinafter with reference to the accompanying drawings. FIG. 1 briefly shows the structure of the laser irradiation optical system 1 of a first embodiment of the present invention. The laser irradiation optical system 1 comprises a laser light source 11, beam expander 12, a first diffraction optical element (DOE) 13, lens 14, and second DOE 15. The DOE 13 lens 14, and DOE 15 are the dividing means, condensing means, and shaping means, respectively.

The beam expander 12 is disposed so as to have the optical axis of the beam expander 12 match the optical axis Ax of the lens 14, and the DOE 13 and 15 are disposed perpendicular to the optical axis Ax. The laser light source 11 is arranged so as to have the center of the emitted laser beam L1 match the optical axis Ax.

Although a variety of light sources may be used as the laser light source 11, when using a an irradiating laser beam to process the surface of an object, a light source emitting a high intensity laser, e.g., a YAG laser, carbon dioxide laser or the like is desirable. The light source 11 is set beforehand to emit laser beam L1 as a parallel beam, the intensity distribution of the laser beam L1 remains a Gaussian type. The beam expander 12 broadens the beam width of the laser beam L1 emitted from the light source 11. Other than broadening the beam width, the beam expander 12 does not produce a change in the size of the intensity distribution of the laser beam L1.

The first DOE 13 diffracts the first laser beam L1 after the beam width has been broadened by the beam expander 12, and divides the beam L1 into a plurality of second laser beams L2. FIG. 1 shows an example of a laser beam L1 divided into four laser beams L2. The width of the laser beams L2 generated by diffraction is approximately equal to the beam width of the laser beam L1, although the direction of travel of the beams L2 differ due to the degree of diffraction.

The lens 14 has positive optical power, and the focal point on the front side is positioned on the DOE 13. Accordingly, all of the laser beams L2 from the DOE 13 are traveling in the same direction via the lens 14, and each laser beam L2 become condensed beams on the focal plane fp on the back side of the lens 14. The lens 14 is arranged in the optical path in which the laser beams L2 overlap.

Although all the optical elements have thickness, the principal point of the elements having optical power such as the lens 14, and the diffraction surface of the diffraction elements such as the DOE 13 and DOE 15, have standard element position and distance between elements.

The laser beam L2 entering the lens 14 overlap other laser beams L2, but each laser beam L2 is condensed to a condensed beam by the lens 14, such that the laser beams L2 are mutually separated after passing through the lens 14.

Moreover, the separation position of the laser beams L2 is nearer to the DOE 13 than the separation position when a lens 14 is not present.

The second DOE 15 is disposed in the optical path behind the position at which the laser beams L2 are mutually separated. The DOE 15 converts the intensity distribution of each laser beam L2 in a cross section perpendicular to the optical path to produce a specified distribution from a Gaussian type, e.g., a distribution of uniform intensity having a rectangular contour. In this way, the laser beams L2 are shaped in a direction perpendicular to the optical path. The laser irradiation optical system 1 irradiates the surface of an irradiation object with the laser beams L2 shaped by the DOE 15.

The laser beams L2 from the DOE 15 are condensed at the focal plane fp of the lens 14. Accordingly, if the area near the focal plane fp is designated the irradiation object surface S, a specific intensity distribution of the laser beams L2 on the irradiation object surface S can be obtained and the beam width can be reduced.

The DOE 13 which divides the laser beam L1 into a plurality of laser beams L2 is fabricated by performing n number of relief process on a flat surface to produce a binary type diffraction element having a flat surface of 2n levels (height). The DOE 13 has grating units (hereinafter referred to as "subcells") arrayed periodically in two-dimensions within a photoreception area (hereinafter referred to as "cell"), and the diffraction conditions are determined by the size, i.e., array period, of the subcells, and the setting sequence of the levels of fine unit flatness (hereinafter referred to as "pixels") forming the subcell.

The diffraction conditions of the DOE 13 may be determined in accordance with the purpose of the laser irradiation optical system 1; the laser beam L1 may be unidimensionally diffracted to produce one line of laser beams L2, or the laser beam L1 may be two-dimensionally diffracted to produce a plurality of lines of laser beams L2. It is possible for adjacent laser beams L2 traveling in the same diffraction direction to have a fixed different in the degree of diffraction, and it is also possible for adjacent laser beams L2 to have different differences in degree of diffraction. The relative intensity of each laser beam L2 may be freely set, but in the present instance, all laser beams L2 have equal intensity.

The level of each pixel within the subcell is set depending on the degree of the diffraction beam output as a laser beam L2, e.g., a calculation can be made by a nonlinear optimization algorithm.

Figure 6:
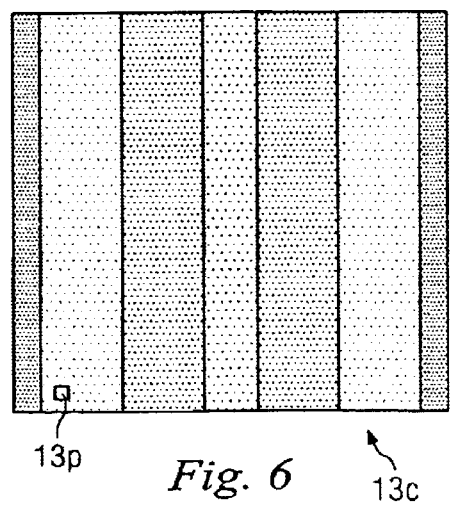
FIG. 6 is a plan view showing a example of an level distribution within a grating unit of a binary type diffraction element used for division in the laser irradiation optical system of each embodiment.

An example of a level distribution of pixels within one subcell of the DOE 13 is shown in FIG. 6. This example describes when a laser beam L1 is unidimensionally diffracted and divided to produce four laser beams L2 having diffraction degrees of −3, −1, +1, +3. In this example, the subcell 13c is square in shape with levels in four stages, and the subcell 13c is divided into 32 vertical by 32 horizontal pixels 13p, and the level of each pixel 13p is calculated. Since diffraction is unidimensional, the pixels 13p are arrayed in one direction.

Figure 7:
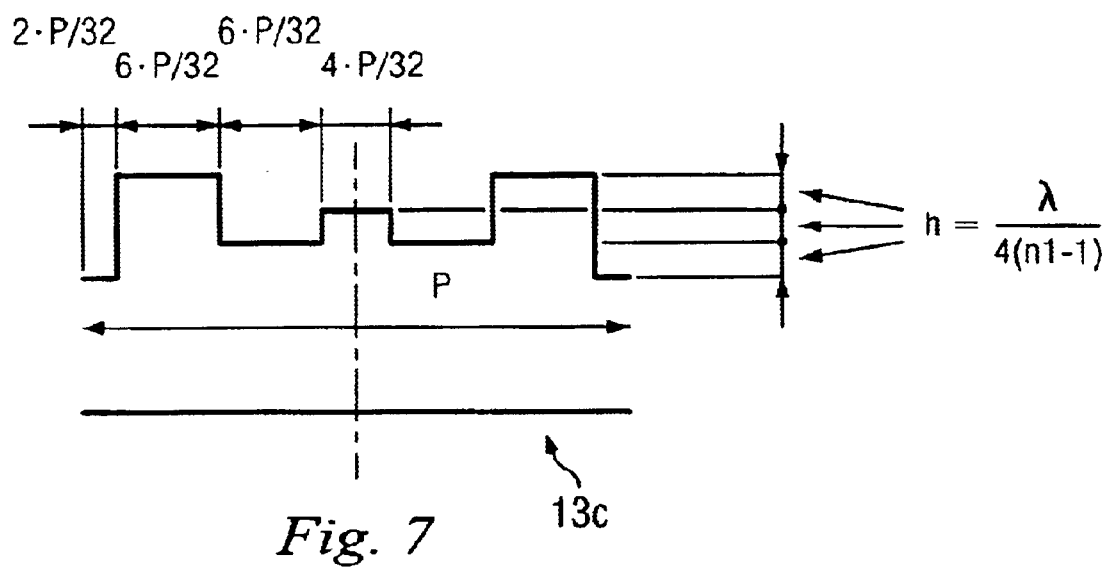
FIG. 7 is a section view of the grating unit of FIG. 6 in the direction of diffraction.

A cross section in the diffraction direction (left-to-right direction in the drawing) of the subcell 13c of FIG. 6 is shown in FIG. 7. When the wavelength of the laser beam L1 is designated λ and the refractive index of the substrate of the DOE 13 relative to the wavelength λ is designated n1, the difference h between adjacent levels is $\lambda/\{4\cdot(n1-1)\}$, and the difference between the highest level and the lowest level becomes 3·h. When the size, i.e., the array pitch, of the subcell 13c in the diffraction direction is represented by P,
there is a band of level 2·h and width 4·P/32 (equivalent to four pixels 13p) in the center, bands of level 1·h and width 6·P/32 on bilateral sides thereof, and bands of level 3·h and width 6·P/32 to the outside thereof, and bands of level 0·h and width 2·P/32 to the further outside thereof.

Figure 12:
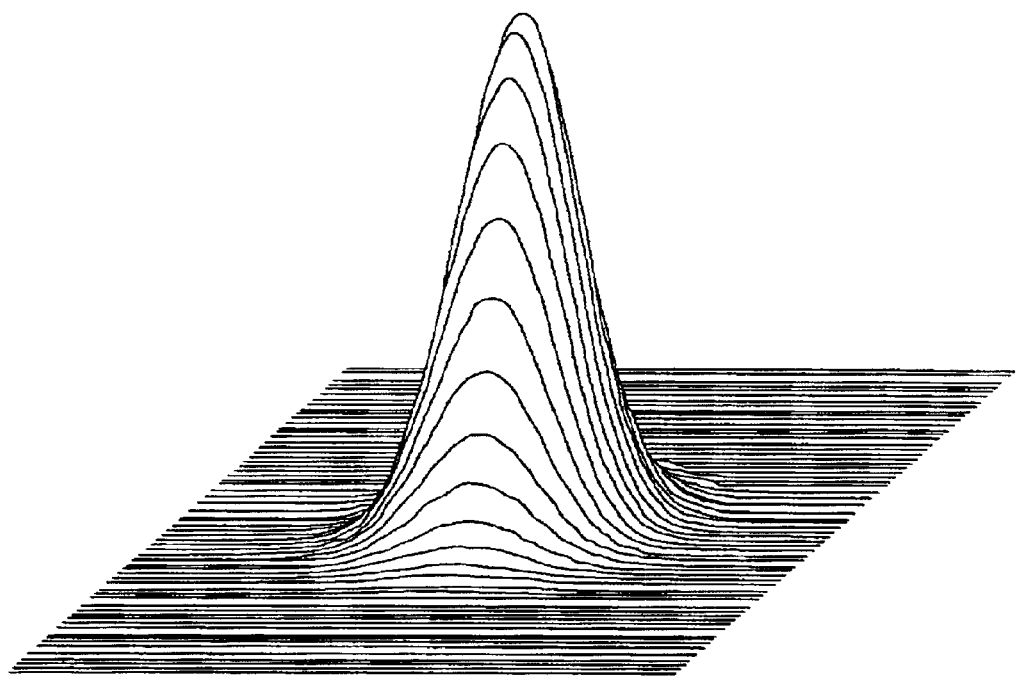
FIG. 12 is a perspective view of the intensity distribution of a divided laser beam in the laser irradiation optical system of each embodiment.

At these settings, the four laser beams L2 having the aforesaid degrees of diffraction have equal intensity, and excellent efficiency is obtained. The uniformity (value obtained by dividing the difference between the largest intensity and the smallest intensity by of the sum of the both intensities) of the four laser beams L2 became 3.4%, the diffraction efficiency (value obtained by dividing the total sum of the intensities of the laser beams L2 by the intensity of the laser beam L1) became 83.5%. The intensity distribution of the divided laser beams L2 was nearly identical with the intensity distribution of the laser beam L1 from the beam expander 12, and is Gaussian in type. The intensity distribution of the laser beam L1 is shown in FIG. 12.

When all levels diverge from the statistically calculated value due to errors of shape of the diffraction grating, the influence of these errors a concentration of laser beam intensity at a diffraction degree of [0]. Accordingly, the intensity of the laser beams at a diffraction of degree [0] is largely controlled by the precision of the grating formation. As in the illustrated example, when laser beams L2 have a diffraction degree other than [0] are obtained, it is possible to avoid large influence on the laser beams L2 even when, for example, there are statistical errors produced during formation of the diffraction grating. Setting of the diffraction degree in this manner is particularly desirable for increasing the uniformity among the laser beams L2.

The DOE 15 which shapes the laser beams L2 is a diffraction element of the free curvature type having a moderately ranged curved surface. The diffraction conditions of the laser beams L2 produced by the DOE 15 is determined by the shape of the cell curve. and is set in accordance with the contour of the cross section perpendicular to the optical path of each laser beam L2 and the intensity distribution at the cross section.

In practice, the phase function of the cell relative to the laser beam L2 is determined so as to obtain a desired intensity distribution, and the cell shape function is determined in consideration of the wavelength and refractive index of the substrate of the DOE 15. The phase function is represented by, for example, a linear combination of a plurality of peaks of different degree, and the coefficient of each peak can be calculated by calculation using a nonlinear optimization algorithm.

Figure 8:
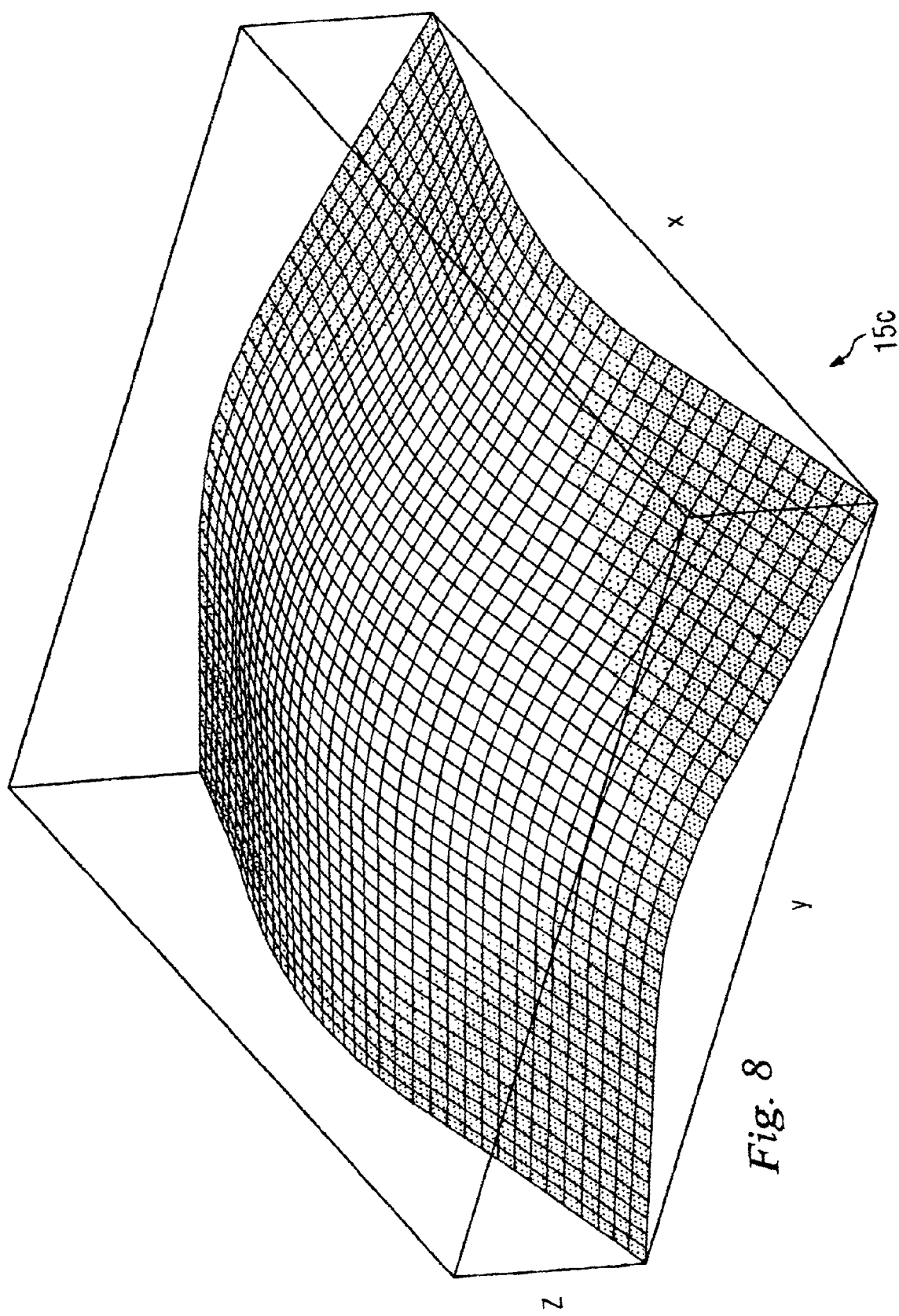
FIG. 8 shows an example of a free curvature for shaping in the laser irradiation optical system of each embodiment.

An example of the phase function of the cell of the DOE 15 is shown in equation 3, and a corresponding cell shape is shown in FIG. 8. This example has each cell 15c which is square in shape and 2 mm on edge corresponding to the four laser beams L2, and the laser beams L2 have a cross section contour that is rectangular forming beams having uniform intensity.

$$\phi(x,y)=2\pi/\lambda \cdot \{C1\cdot(x2,y2)+C2\cdot(x4,y4)+C3\cdot(x6+y6)+C4\cdot(x8,y8)+C5\cdot(x10,y10)\} \qquad \text{Eq. 3}$$

Where x and y are coordinates in mm units designating the center of the cell 15c as the origin, and λ represents the wavelength of the laser beams L2. Coefficients C1~C5 are defined as follows; C1=2.274×10−3 (mm$^{-1}$), C2=1.896× 10−5 (mm$^{-3}$), C3=−6718×10−4 (mm$^{-5}$), C4=−4.352×10−5 (mm$^{-7}$), C5=−4.173×10−5 (mm$^{-9}$). The right side in the parenthesis is the length dimension.

FIG. 8 shows a surface representing the shape coefficient Z (x,y) obtained by the processing of equation 4 at phase function φ(x,y).

$$Z(x,y)=\phi(x,y)\cdot\lambda/\{2\pi\cdot(n2-1)\} \quad \text{Eq. 4}$$

Where n2 represents the refractive index of the substrate of the DOE 15 relative to the wavelength $\lambda$. At this setting, each cell 15c has a simple curvature ranging across the entire interior of the cell.

Figure 9:
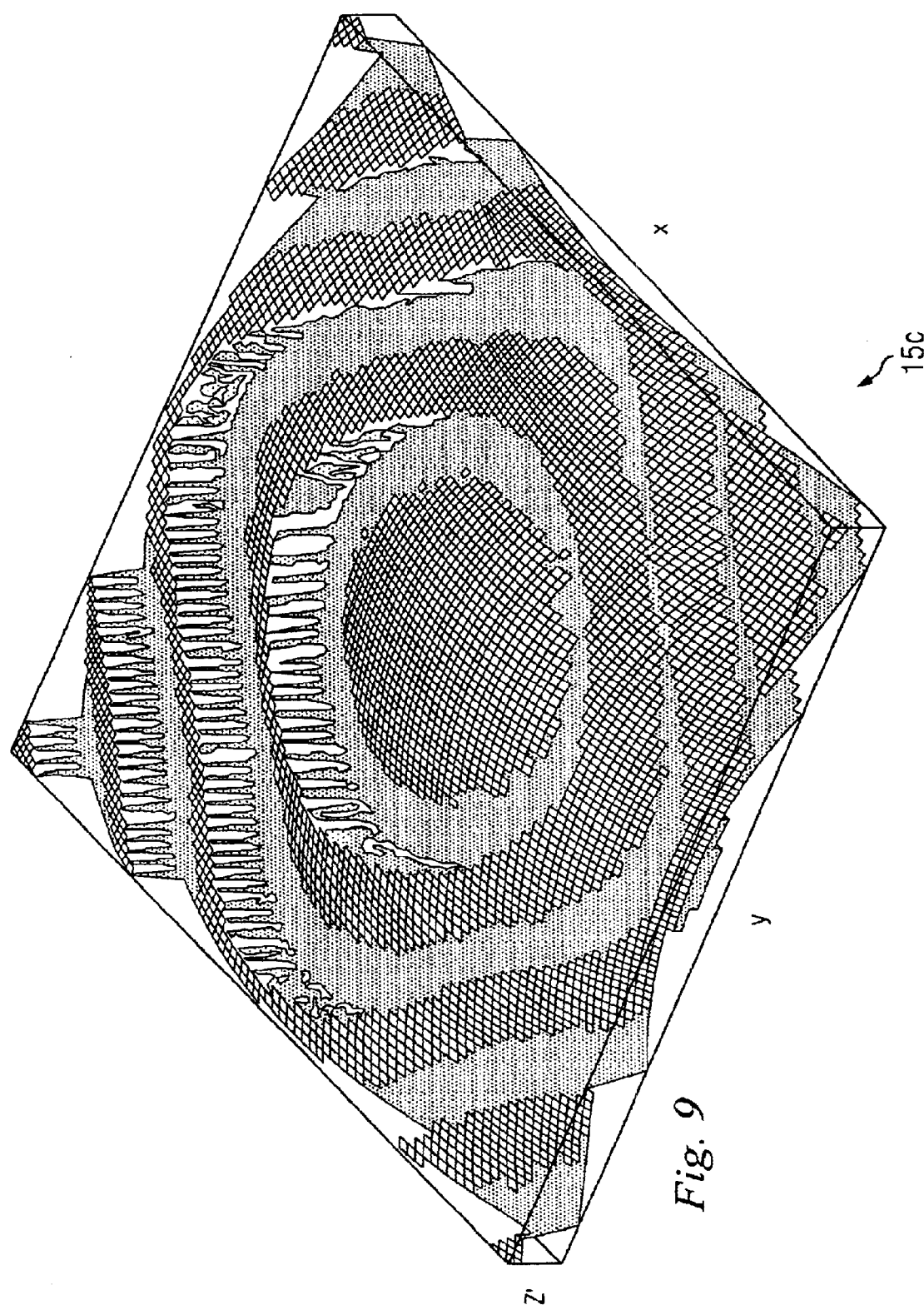
FIG. 9 is a perspective view of the curved surface of a free curvature type diffraction element for shaping equivalent to the curved surface of FIG. 8.

FIG. 9 shows a surface representing the shape coefficient $Z'(x,y)$ obtained by the standardized processing of equation 5 at phase function $\phi(x,y)$.

$$Z'(x,y)=\text{modulo }\{\phi(x,y),2\pi\}\cdot\lambda/\{2\pi\cdot(n2-1)\} \quad \text{Eq. 5}$$

Where modulo represents the remainder of a first variable modulus of a second variable, and $Z'(x,y)$ is equivalent to $Z(x,y)$. At this setting, each cell 15c has a plurality of curvatures of identical level at each period of the phase, i.e., $2\pi$, an increase in thickness of the DOE 15 is avoided, and the DOE 15 can be easily fabricated.

Figure 10:
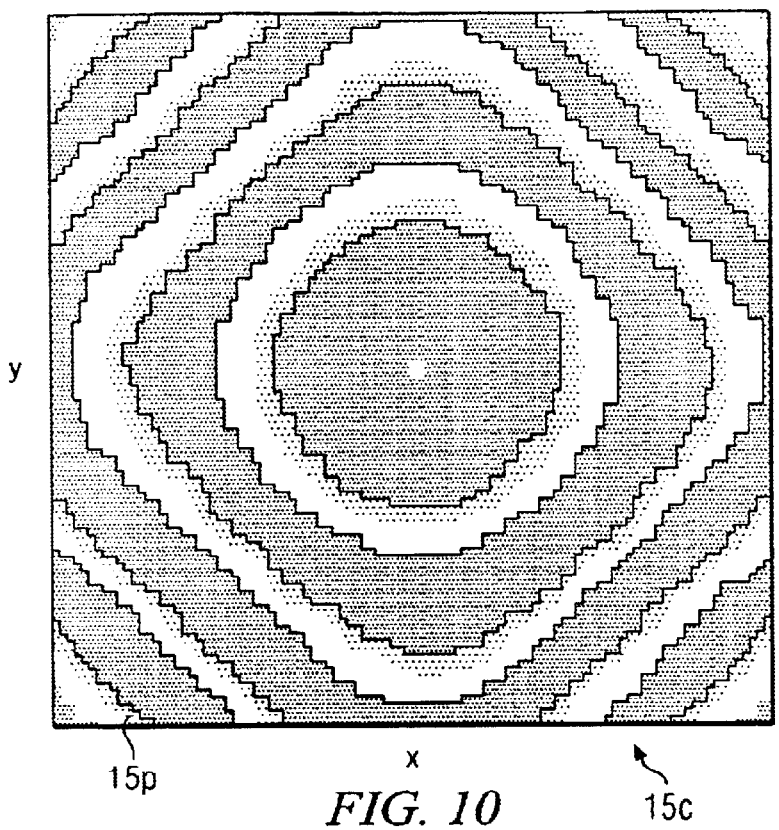
FIG. 10 is a plan view showing the level distribution of the binary type diffraction element for shaping equivalent to the curved surface of FIG. 8.

The DOE 15 also may be a binary type in place of a free curvature type. An example of a diffraction grating of a binary type obtained from the function $Z'(x,y)$ of equation 5 is shown in FIG. 10. In this case, each cell 15c is divided into 64 vertical by 64 horizontal unit plane (hereinafter referred to as 'pixels" as in the unit plane within the subcell) 15p forming levels in 16 stages, and the function value of the center of each pixel 15p is determined, and the level nearest this value is designated the level of that pixel.

Figure 11:
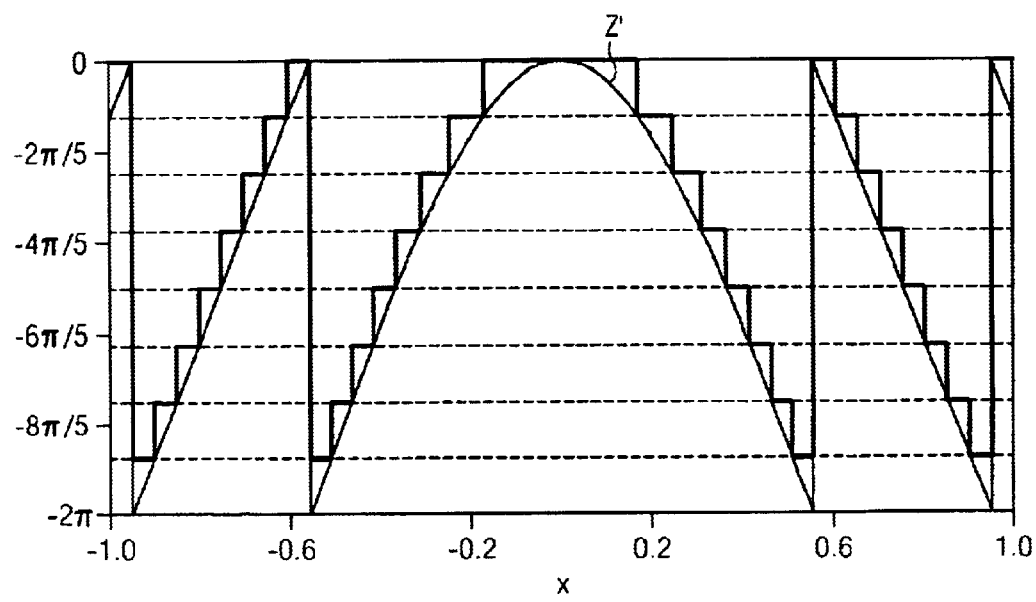
FIG. 11 is a section view of the setting of another level of the binary type diffraction element for shaping equivalent to the curved surface of FIG. 8.

A diffraction element of the binary type which does not have pixels of fixed size also may be used. A method for obtaining such a diffraction grating from function $Z'(x,y)$ of equation 5 is shown in FIG. 11. This example has levels of eight stages at equal intervals, and the range wherein a function value exceeds one level but is less than the next level is designated the same plane.

A binary type diffraction element can easily be fabricated by photolithography using semiconductor technology. Such an element can also be fabricated by processing using electron beam drawing. In these methods, a metal mold is produced by performing a relief process on the surface of a photographic plate, and transferring the relief from the metal mold to a transparent resin material, thus allowing high efficiency mass production of a diffraction grating.

Figure 13:
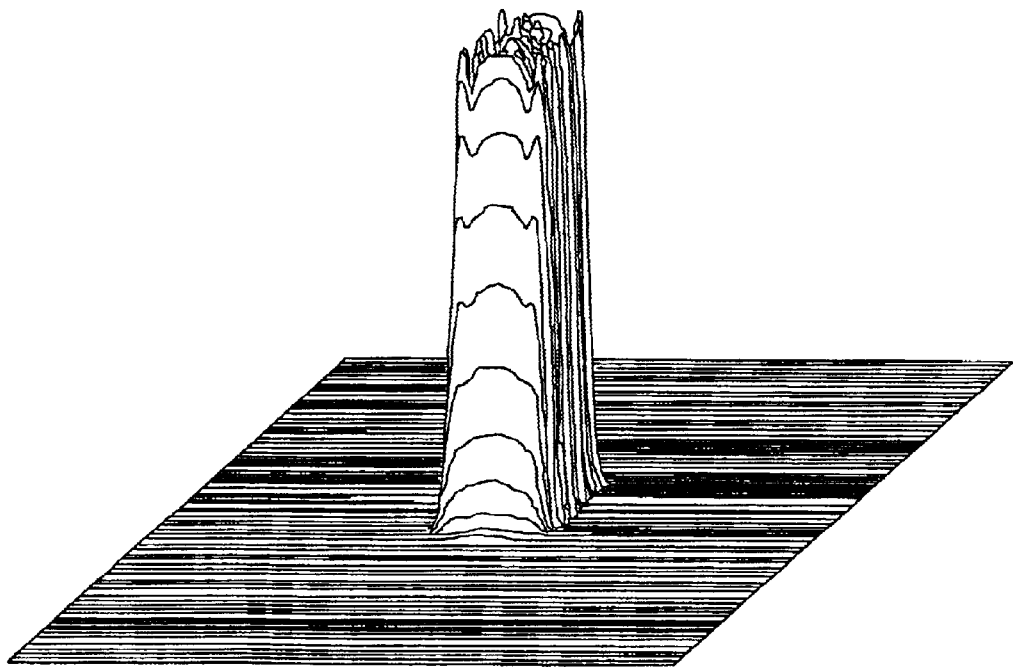
FIG. 13 is a perspective view of the intensity distribution of a shaped laser beam in the laser irradiation optical system of each embodiment.

The intensity distribution of each laser beam L2 after shaping by the DOE 15 fabricated according to the shape function of equation 5 is shown in FIG. 13. The shaped laser beams L2 have a rectangular contour with a uniform intensity distribution from the center to the periphery at the irradiation object surface S compared to the laser beams L2 divided by the DOE 13 which have the Gaussian type intensity distribution shown in FIG. 12. The width of the laser beam L2 on the object surface S is approximately 120 $\mu$m. The integral value of the intensity of the laser beam L2 is approximately the same before and after shaping, and shaping is accomplished with high efficiency.

When the laser beams L2 entering the DOE 15 overlap, it becomes difficult to design the diffraction grating of the DOE 15 to convert to a desired intensity distribution. For this reason the DOE 15 is desirably positioned in the optical path wherein the laser beams L2 are completely separated.

The position of the DOE 15 for shaping the laser beams L2 is described below. The various factors participating in the positioning of the DOE 15 are include the wavelength of the laser beams L1 and L2, the focal length f of the lens 14, the beam width W of the laser beam L1 in the diffraction direction of the laser beam L2, and the array period p of the grating unit of the DOE 13 in the diffraction direction of the laser beam L2.

The DOE 13 for dividing the laser beam L1 is set so as to produce diffraction within the paraxial range of the function $\sin(\theta)=\theta$ (where $\theta$ represents the diffraction angle in radian units). Accordingly, the diffraction angle $\theta k$ of the laser beam L2 of diffraction degree k is expressed by equation 6, and the distance dk from the optical axis Ax of the center of the beam at the position of the lens 14 is expressed by equation 7.

$$\theta k=k\cdot\lambda/p \quad \text{Eq. 6}$$

$$dk=f\cdot\theta k=f\cdot k\cdot\lambda/p \quad \text{Eq. 7}$$

When two adjacent laser beams among the laser beams L2 are designated La and Lb and the respective degree of diffraction of these beams are designated ka and kb, the center-to-center distance $\Delta d$ between the laser beams La and Lb is expressed by equation 8.

$$\Delta d=|ka-kb|\cdot f\cdot\lambda/p \quad \text{Eq. 8}$$

The beam width of all laser beams L2 in the diffraction direction at the position of the lens 14 is W.

The beam width of the laser beams La and Lb condensed by the lens 14 becomes narrower, and the laser beams La and Lb are mutually separated at a position where the beam width has a center-to-center distance $\Delta d$. This position is the distance of $f\cdot\Delta d/W$ from the focal plane on the back side of the lens 14. Accordingly, the laser beams La and Lb are separated at a position moving only the distance Zab of equation 9 from the lens 14.

$$Zab=f\cdot(1-\Delta d/W)=f\cdot\{1-|ka-kb|\cdot f\cdot\lambda/(p\cdot W)\} \quad \text{Eq. 9}$$

The difference in the degree of diffraction of the laser beams L2 need not necessarily by constant. If the difference of diffraction degree differs, the center-to-center distance of adjacent laser beams L2 at the position of the lens 14 differs, and the two laser beams L2 having the smallest difference in diffraction degree ultimately become separated at a position most separated from the lens 14. This position Z1 is expressed by equation 10 below when the minimum value of the absolute value of the difference in diffraction degree of the laser beams L2 is designated m.

$$Z1=f\cdot\{1-m\cdot f\cdot\lambda/(p\cdot W)\} \quad \text{Eq. 10}$$

The laser beams L2 condensed by the lens 14 become divergent beams after being condensed at the focal plane fp on the back side of the lens 14, so as to again mutually overlap. The position Z2 at which overlap begins is symmetrical to the position at which separation ends and is related to the focal plane fp of the lens 14, as expressed by equation 11 below.

$$Z2=f\cdot\{1+m\cdot f\cdot\lambda/(p\cdot W)\} \quad \text{Eq. 11}$$

Ultimately, the laser beams L2 attain a state of mutual separation within a range greater than Z1 and less than Z2. Accordingly, in the laser irradiation optical system 1 of the present embodiment, the position Zd of the DOE 15 acting as the shaping means relative to the lens 14 acting as the condensing means is expressed by equation 1 below.

$$f\cdot\{1-m\cdot\lambda\cdot f/(p\cdot W)\}\leq Zd\leq f\cdot\{1+m\cdot\lambda\cdot f/(p\cdot W)\} \quad \text{Eq. 1}$$

The left side of equation 1 is a value greater than 0; the left side of the equation 1 is greater than 0 when the laser beams L2 are separated at a position separated from the lens 14.

According to these settings, the laser irradiation optical system 1 is capable of reliably and easily shaping the emitted laser beams L2 to a desired shape. The position Zd of the DOE 15 may be set anywhere within the range of equation 1, but is desirably set nearer the lens 14. The overall construction is compact, the conversion of the intensity distribution is performed with the cross section of the laser beams L2 in a broad state, the diffraction grating of the DOE 15 can be easily designed, and the conversion efficiency is high.

When the laser beam L1 is diffracted two-dimensionally by the DOE 13,the diffraction directions of the respective laser beams L2 are set such that equation 1 obtains.

Specific numerical examples are described below. A YAG laser is used as the light source 11, and the wavelength λ of the laser beam L1 is 532 nm. The focal length f of the lens 14 is 100 mm, and the four laser beams L2 having the previously described diffraction degrees of −3, −1, +1, +3 are emitted as equal intervals of 2 mm.

At this time, the minimum value m of the absolute value of the difference in diffraction degree of the laser beams L2 is 2, and the subcell array period p of the DOE 13 is set at 53.2 μm to have the spacing of the laser beams L2 at the aforesaid value. When the beam width W of the laser beam L1 entering the DOE 13 from the beam expander 12 is set at 5 mm, equation 1 becomes equation 12 below.

$$60 \text{ (mm)} \leq Zd \leq 140 \text{ (mm)} \qquad \text{Eq. 12}$$

Figure 2:
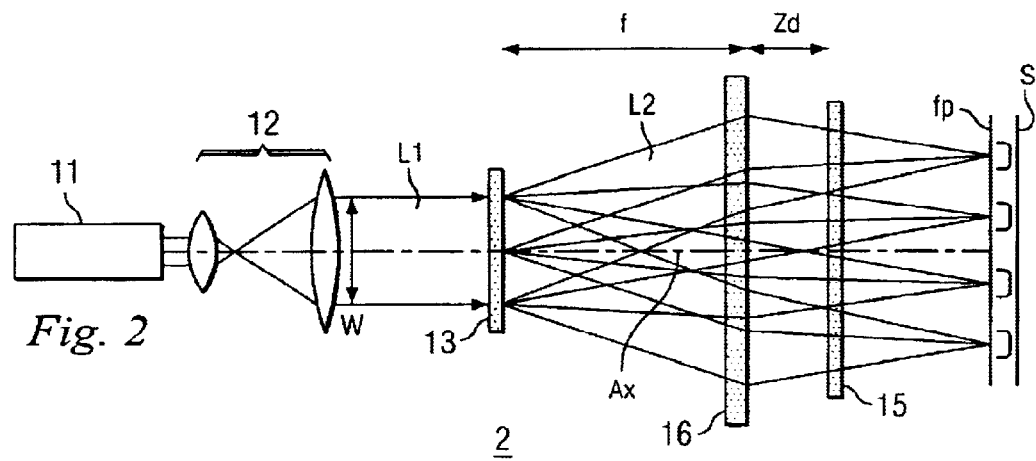
FIG. 2 briefly shows the structure of the laser irradiation optical system of a second embodiment of the present invention.

The construction of a laser irradiation optical system 2 of a second embodiment is briefly shown in FIG. 2. The laser irradiation optical system 2 is provided with a third DOE 16 as a condensing means to replace the lens 14 of the laser irradiation optical system 1. Other structural elements are identical to the laser irradiation optical system 1, and redundant description is omitted.

The DOE 16 has positive optical power, and the focal point on the front side is positioned on the DOE 13. The DOE 16 is arranged in the optical path wherein the laser beams L2 from the DOE 13 overlap, and the position Zd of the DOE 15 relative to the DOE 16 is set so as to satisfy equation 1.

A diffraction element having optical power such as the DOE 16 may be fabricated by relief process, or hologram exposure. In the laser irradiation optical system 2 using a diffraction element as a condensing means, distortion of the laser beams L2 is suppressed, and each laser beams L2 is even more uniform at the irradiation object surface S.

Figure 3:
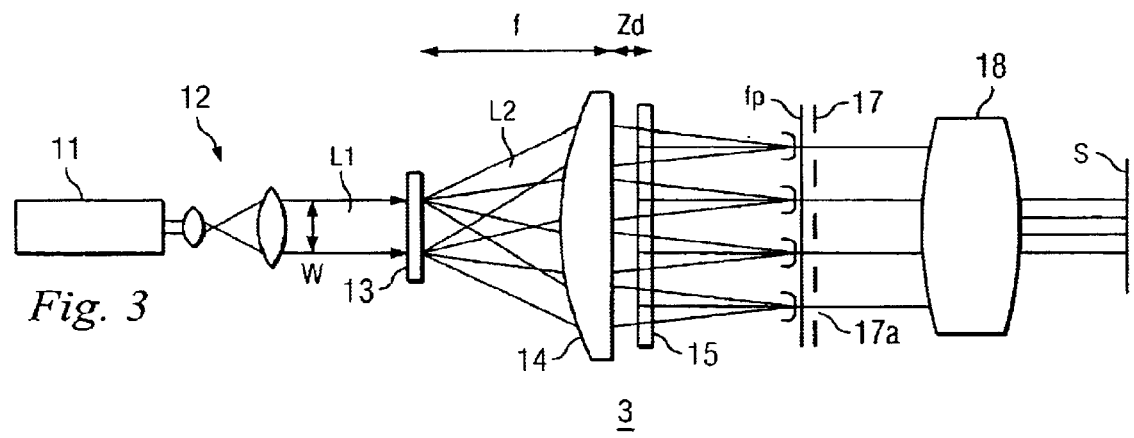
FIG. 3 briefly shows the structure of the laser irradiation optical system of a third embodiment of the present invention.

The construction of a laser irradiation optical system 3 of a third embodiment is briefly shown in FIG. 3. The laser irradiation optical system 3 is provided with a light shield 17 having an opening 17a, and a reducing optical system 18 positioned in the optical path behind a position at which the laser beams L2 from the DOE 13 are mutually separated.

The focal point of the lens 14 on the front side is positioned on the DOE 13 which divides the laser beam L1. The laser beams L2 divided by the DOE 13 enter the lens 14 in a mutually separated state, travel in the same direction, and are condensed as condensed beams at the focal plane fp on the back side of the lens 14. The DOE 15 which shapes the laser beams L2 is disposed between the lens 14 and the focal plane fp.

The light shield 17 is disposed near the focal plane fp of the lens 14, and the opening 17a of the light shield 17 is provided at a position to receive the laser beam L2. The light shield 17 blocks part of the periphery of each laser beam L2 shaped by the DOE 15, so as to produce an even more defined contour to the cross section of the laser beams L2.

Figure 14:
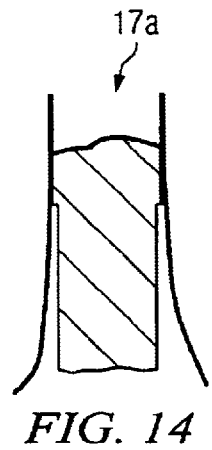
FIG. 14 is a section view showing the condition of reshaping of the shaped laser beam by the opening in the laser irradiation optical systems of the third through fifth embodiments.
Figure 15:
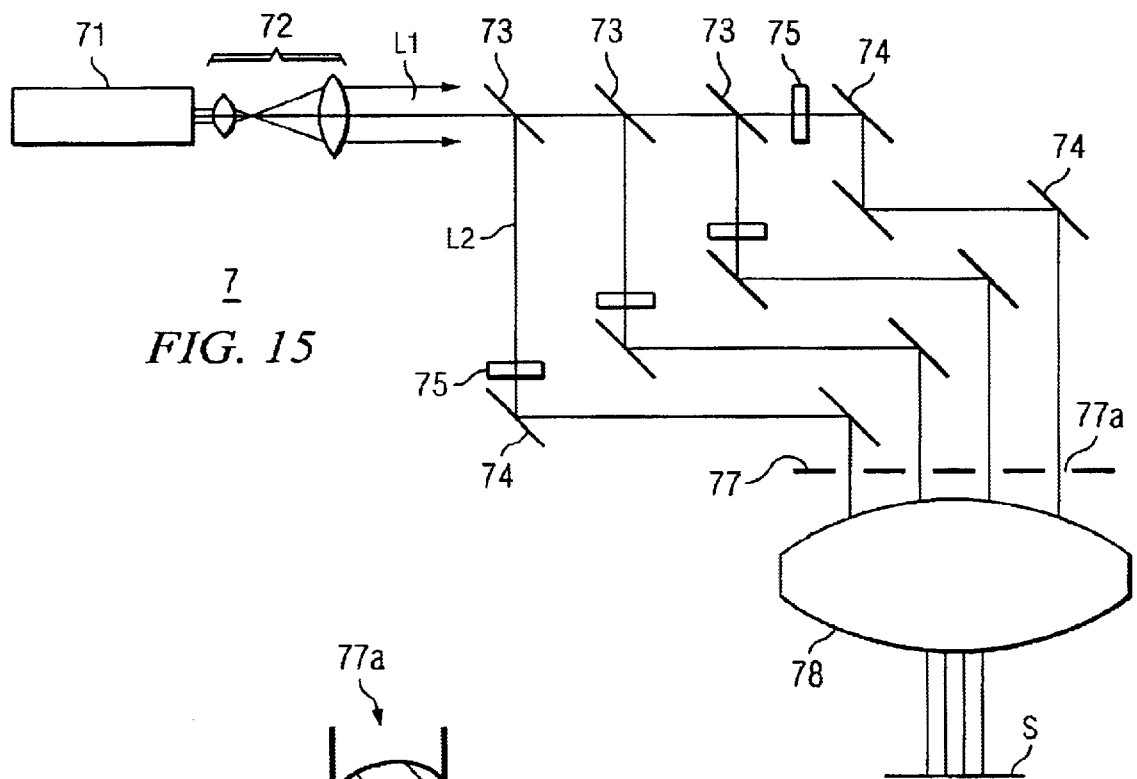
FIG. 15 briefly shows the structure of a conventional laser irradiation optical system.
Figure 16:
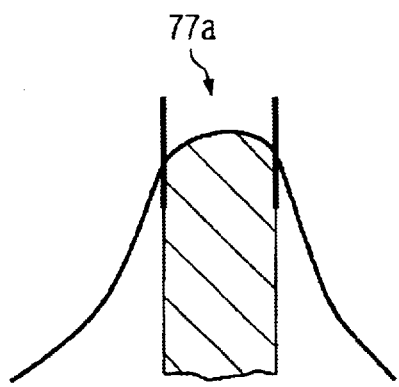
FIG. 16 is a section view showing the condition of shaping of the laser beam by the opening in the conventional laser irradiation optical system.

When there is a uniform intensity distribution of the cross section perpendicular to the optical path of the laser beam L2 by the DOE 15, the condition of the shaping accomplished by the opening 17a of the light shield 17 is schematically shown in FIG. 14. The laser beams L2 shaped by the DOE 15 have a virtually unchanged intensity distribution although part is changed moderately. and there is slight loss of light caused by the shaping by the light shield 17. The laser irradiation optical system 3 greatly improves the laser usage efficiency compared to a conventional; optical system which shapes the beam using a light shield 77 and the beam intensity distribution maintains a Gaussian type distribution as shown in FIG. 16.

The reducing optical system 18 is arranged so as have its optical axis match the optical axis Ax of the lens 14. The laser beams L2 passing through the opening 17a of the light shield 17 are narrowed in beam width and mutual spacing by the reducing optical system 18, and irradiate the irradiation object surface S.

In the laser irradiation optical system 3, the spacing of the laser beams L2 is wider after passing through the lens 14 compared to the laser irradiation apparatuses 1 and 2 having the lens 14 and DOE 16 disposed in the optical path wherein the laser beams L2 overlap. Moreover, the spacing of the emitted laser beams L2 can be approximately the same as the laser irradiation apparatuses 1 and 2 by providing the reducing optical system 18.

When the spacing of the laser beams L2 need not be narrow, the reducing optical system 18 is unnecessary. Furthermore, the light shield need not necessarily be provided excluding when even greater uniformity of the intensity distribution is required and when a particularly distinct cross section contour is required since the laser beams L2 are sufficiently shaped by the DOE 15. When the light shield 17 and the reducing optical system 18 are omitted, the DOE 15 may be disposed anywhere in the optical path from divergence of the laser beams L2 to the position at which they again overlap.

Even when the lens 14 is disposed in the optical path behind the position at which the laser beams L2 from the DOE 13 are separated as in the present embodiment, the position Z2 at which the laser beams L2 again begin to overlap conforms to equation 11. Accordingly, the position Zd of the DOE 15 relative to the lens 14 may satisfy equation 13.

$$0 \leq Zd \leq f \cdot \{1 + m \cdot f \cdot \lambda / (p \cdot W)\} \qquad \text{Eq. 13}$$

Figure 4:
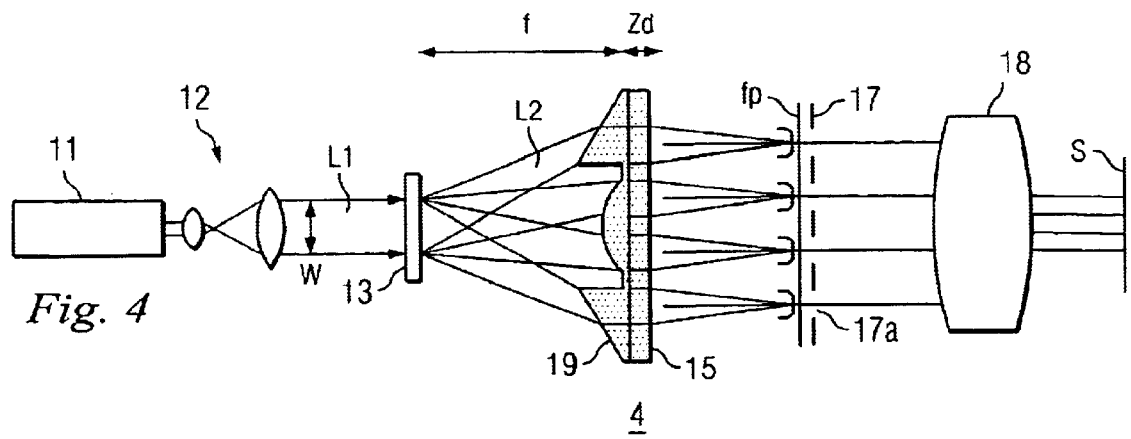
FIG. 4 briefly shows the structure of the laser irradiation optical system of a fourth embodiment of the present invention.

The construction of a laser irradiation optical system 4 of a fourth embodiment is briefly shown in FIG. 4. The laser irradiation optical system 4 uses a prism-like lens 19 having a difference in level as a condensing means, and an integrated element of DOE 15 and a lens 19 as a shaping means. Other structural elements are identical to those of the laser irradiation optical system 3.

The focal point on the front side of the lens 19 is positioned on the DOE 13 which divides the laser beam L1, and the lens 19 itself is disposed in the optical path behind the position at which the laser beams L2 from the DOE 13 are mutually separated. The position Zd of the DOE 15 relative to the lens 19 satisfies the equation 13, and Zd very closely approaches the state of Zd=0 since the DOE 15 and the lens 19 are integratedly formed.

The DOE 15 and the lens 19 forming an integrated element may be easily fabricated by resin molding using two metal molds corresponding to the two elements, thereby achieving excellent manufacturing efficiency.

Figure 5:
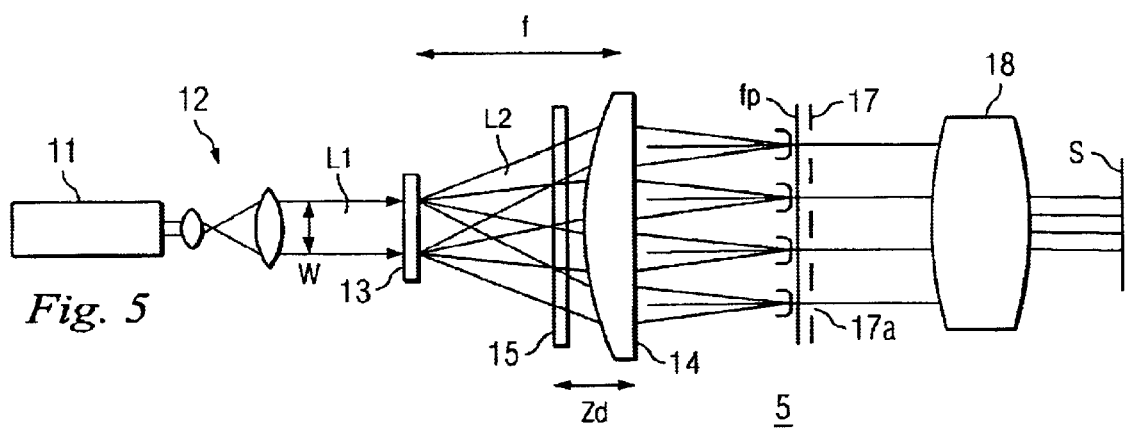
FIG. 5 briefly shows the structure of the laser irradiation optical system of a fifth embodiment of the present invention.

The construction of a laser irradiation optical system 5 of a fifth embodiment is briefly shown in FIG. 5. The laser irradiation optical system 5 disposes the DOE 15 of the laser irradiation optical system 3 of the third embodiment between the DOE 13 and the lens 14. The DOE 15 is disposed behind the position at which the laser beams L2 from the DOE 13 are mutually separated.

The position of the DOE 15 in the laser irradiation optical system 5 is described below. The definition of the symbols λ, W, p, and f used in the following discussion are identical to the definitions used in the first embodiment.

When two adjacent laser beams among the laser beams L2 are designated La and Lb and the respective degree of diffraction of these beams are designated ka and kb, the center-to-center distance Δd between the laser beams La and Lb at the position of the lens 14 is expressed by equation 8. The width in a direction perpendicular to the optical axis Ax of all laser beams L2 in the optical path from DOE 13 to the lens 14 is the beam width W of the laser beam L1 in the direction of diffraction under the condition of paraxial diffraction.

The laser beams La and Lb from the DOE 13 maintain a width W in a direction perpendicular to the optical axis Ax, and the overlap decreases such that the beams are separate at the position at which the center-to-center distance Δd becomes the width W. This position is the distance $f \cdot W/\Delta d$ from the DOE 13, and if the lens 14 is standard, the position Zab at which the laser beams La and Lb are separated is expressed by equation 14.

$$Zab = f \cdot W/\Delta d - f = f \cdot \{p \cdot W/(|ka-kb| \cdot f \cdot \lambda) - 1\} \qquad \text{Eq. 14}$$

When the difference in diffraction degree of the laser beams L2 is not fixed, the beams having the smallest difference in diffraction degree are ultimately separated at the position nearest the leans 14. This position Z0 is expressed by equation 15 below when the minimum value of the absolute value of the difference if the diffraction degree of the laser beams L2 is designated m.

$$Z0 = f \cdot \{p \cdot W/(m \cdot f \cdot \lambda) - 1\} \qquad \text{Eq. 15}$$

Accordingly, in the laser irradiation optical system 5 of the present embodiment, the position Zd of the DOE 15 relative to the lens 14 is limited to the range expressed by equation 16.

$$f \cdot \{p \cdot W/(m \cdot \lambda \cdot f) - 1\} \leq Zd \leq 0 \qquad \text{Eq. 16}$$

The left side of the equation is a value less than 0; the left side of the equation is less than 0 when the laser beams L2 are separated at the lens 14.

When the lens 14 is positioned behind the position at which the laser beams L2 from the DOE 13 are separated, the position Zd of the DOE 15 relative to the lens 14 may satisfy wither equation 13 or equation 16, an ultimately is stipulated by equation 2.

$$f \cdot \{p \cdot W/(m \cdot \lambda \cdot f) - 1\} \leq Zd \leq f \cdot \{1 + m \cdot \lambda \cdot f/(p \cdot W)\} \qquad \text{Eq. 2}$$

In the laser irradiation optical systems 1~5 of the embodiments, the laser beam L1 is divided by diffraction and the divided laser beams L2 overlap, and the DOE 15 diffraction conditions may be set relative to a single beam since the DOE 15 is disposed to shape the laser beams L2 within a range of the optical path at which the beams are separated. For this reason, there is a high decree of freedom to the diffraction conditions of the DOE 15, such that an intensity distribution can easily be produced in accordance with the purpose of use.

The laser irradiation optical systems of the embodiments are compact and reduce the number of structural elements since laser beam division occurs only once, and mutual positioning of the structural elements is easily accomplished. Moreover, each of the divided beams can be easily and reliably shaped to a desired shape because the divided laser beams have the same beam width as the laser beam before division and they are in a separated state when shaped. Since the divided laser beams form condensed beams traveling in the same direction, the irradiation object surface can be irradiated from the same direction, and the range of irradiation of each laser beam can easily be made small. The separation of the divided laser beam scan be promoted by condensing the divided laser beams, thereby rendering the overall structure more compact.

In a construction wherein a dividing means is an element which divides a first laser beam by diffraction to produce second laser beams, and a condensing means is an element having a focal point on or near the dividing means, and these elements are disposed so as to satisfy the relationship of equation 1 or 2, the divided laser beams are easily made equivalent, the divided laser beams are reliably shaped in a state of mutual separation, and shaping of the beams is exceedingly easy.

When the condensing means and the shaping means are a single integrated element, mutual positioning becomes unnecessary, adjustment is simple, and the overall construction is rendered even more compact.

When the shaping means is a single element having a plurality of parts for converting the intensity distribution of the second laser beams, the position of the shaping means relative to the dividing means and the condensing means is easily adjusted.

When the shaping means is an element for converting the intensity distribution of the second leaser beams by diffraction, the freedom of the shaping means increases, and the irradiating laser beams can be easily shaped to a desired shape. Furthermore, loss of the laser by shaping is suppressed, so as to produce a laser irradiation optical system of excellent efficiency.

Although the present invention has been fully described by way of examples with reference to the accompanying drawings, it is to be noted that various changes and modification will be apparent to those skilled in the art. Therefore, unless otherwise such changes and modifications depart from the scope of the present invention, they should be construed as being included therein.

What is claimed is:

1. A laser irradiation optical system comprising:
    a dividing means for dividing a first entering laser beam once, and producing a plurality of second laser beams having beam widths equal to the beam width of the first laser beam and advancing in mutually different directions;
    a condensing means for condensing each second laser beam to mutually advance in nearly the same direction; and
    a shaping means for converting an intensity distribution of a cross section perpendicular to a system optical path in a laser optical path of each of the mutually separated second laser beams, the shaping means being arranged in the system optical path anterior to a focal plane where each second laser beam is condensed by the condensing means.

2. The laser irradiation optical system claimed in claim 1, wherein the dividing means is an element which divides a first laser beam by diffraction to produce a second laser beam.

3. The laser irradiation optical system claimed in claim 1, wherein the condensing means is an element having a focal point on the dividing means, and arranged in the system optical path in a position where the second laser beams overlap.

4. A laser irradiation optical system comprising:
a dividing means for dividing a first entering laser beam once, and producing a plurality of second laser beams having beam widths equal to the beam width of the first laser beam and advancing in mutually different directions;
a condensing means for condensing each second laser beam to mutually advance in near the same direction; and
a shaping means for converting the intensity distribution of a cross section perpendicular to a system optical path of each second laser beam in a laser optical path of each of the mutually separated second laser beams,
wherein the dividing means is an element which divides a first laser beam by diffraction to produce a second laser beam; and
wherein the condensing means is an element having a focal point on or near the dividing means, and arranged in the system optical path in a position where the second laser beams overlap;
and which satisfies the relationship $$f \cdot \{1 - m \cdot \lambda \cdot f/(p \cdot W)\} \leq Zd \leq f \cdot \{1 + m \cdot \lambda \cdot f/(p \cdot W)\}$$

where $\lambda$ represents the wavelength of the first and second laser beams, f represents the focal length of the condensing means, m represents the minimum value of the absolute value of the difference of the degree of diffraction of the second laser beams in the same diffraction direction, W represents the beam width of the first laser beam in this diffraction direction, p represents the sequence period of the grating unit of the dividing means in this diffraction direction, and Zd represents the distance from the condensing means to the shaping means with the advancing direction of the second laser beam designated positive.

5. The laser irradiation optical system claimed in claim 1, wherein the condensing means is an element having a focal point on the dividing means, and arranged in the system optical path in a position where the second laser beams do not overlap.

6. A laser irradiation optical system comprising:
a dividing means for dividing a first entering laser beam once, and producing a plurality of second laser beams having beam widths equal to the beam width of the first laser beam and advancing in mutually different directions;
a condensing means for condensing each second laser beam to mutually advance in near the same direction; and
a shaping means for converting an intensity distribution of a cross section perpendicular to a system optical path of each second laser beam in a laser optical path of each of the mutually separated second laser beams,
wherein the dividing means is an element which divides a first laser beam by diffraction to produce a second laser beam; and
wherein the condensing means is an element having a focal point on or near the dividing means, and arranged in the system optical path in a position where the second laser beams do not overlap;
and which satisfies the relationship $$f \cdot \{p \cdot W/(m \cdot \lambda \cdot f) - 1\} \leq Zd \leq f \cdot \{1 + m \cdot \lambda \cdot f/(p \cdot W)\}$$

where $\lambda$ represents the wavelength of the first and second laser beams, f represents the focal length of the condensing means, m represents the minimum value of the absolute value of the difference of the degree of diffraction of the second laser beams in the same diffraction direction, W represents the beam width of the first laser beam in this diffraction direction, p represents the sequence period of the grating unit of the dividing means in this diffraction direction, and Zd represents the distance from the condensing means to the shaping means with the advancing direction of the second laser beam designated positive.

7. The laser irradiation optical system claimed in claim 1, wherein the condensing means and the shaping means are a single integrated element.

8. The laser irradiation optical system claimed in claim 1, wherein the shaping means is a single element having a plurality of parts for converting the intensity distribution of the second laser beam.

9. The laser irradiation optical system claimed in claim 1, wherein the shaping means is an element for converting the intensity distribution of the second laser beam by diffraction.

10. A method of converting a laser beam comprising the steps of:
dividing the laser beam into a plurality of diverging secondary laser beams, each secondary laser beam having a beam width approximately equal to the beam width of the laser beam;
condensing each of the plurality of secondary laser beams such that each of the thus condensing secondary laser beams are directed in nearly the same direction; and
altering an intensity distribution of a cross section of a respective secondary laser optical path of each secondary laser beam, each cross section being perpendicular to a system optical path and being in a position anterior to a focal plane where each secondary laser beam is condensed by the condensing means.

11. The method of converting a laser beam claimed in claim 10, wherein the steps of condensing and altering, are accomplished with a single integrated element.

12. The method of converting a laser beam claimed in claim 10, wherein the step of altering is before the step of condensing.

13. The laser irradiation optical system claimed in claim 1, wherein the condensing means is an element having a focal point near the dividing means, and arranged in the system optical path in a position where the second laser beams overlap.

14. The laser irradiation optical system claimed in claim 1, wherein the condensing means is an element having a focal point near the dividing means, and arranged in the system optical path in a position where the second laser beams do not overlap.

15. A laser irradiation optical system comprising:
a divider that divides a first entering laser beam once, and produces a plurality of second laser beams having beam widths equal to the beam width of the first laser beam and advancing in mutually different directions;
a condenser that condenses each second laser beam to mutually advance in nearly the same direction; and
a shaper that converts an intensity distribution of a cross section perpendicular to a system optical path in a laser optical path of each of the mutually separated second laser beams, the shaper being arranged in the system optical path anterior to a focal plane where each second laser beam is condensed by the condenser.

16. The laser irradiation optical system claimed in claim 15, wherein the divider is an element which divides a first laser beam by diffraction to produce a second laser beam.

17. The laser irradiation optical system claimed in claim 15, wherein the condenser is an element having a focal point on the divider, and arranged in the system optical path in a position where the second laser beams overlap.

18. The laser irradiation optical system claimed in claim 15, wherein the condenser is an element having a focal point on the divider, and arranged in the system optical path in a position where the second laser beams do not overlap.

19. The laser irradiation optical system claimed in claim 15, wherein the condenser and the shaper are a single integrated element.

20. The laser irradiation optical system claimed in claim 15, wherein the shaper is a single element having a plurality of parts for converting the intensity distribution of the second laser beam.

21. The laser irradiation optical system claimed in claim 15, wherein the shaper is an element for converting the intensity distribution of the second laser beam by diffraction.

22. The laser irradiation optical system claimed in claim 15, wherein the condenser is an element having a focal point near the divider, and arranged in the system optical path in a position where the second laser beams overlap.

23. The laser irradiation optical system claimed in claim 15, wherein the condenser is an element having a focal point near the divider, and arranged in the system optical path in a position where the second laser beams do not overlap.

24. A laser irradiation optical system comprising:

a divider that divides a first entering laser beam once, and produces a plurality of second laser beams having beam widths equal to the beam width of the first laser beam and advancing in mutually different directions;

a condenser that condenses each second laser beam to mutually advance in near the same direction; and a shaper that converts the intensity distribution of a cross section perpendicular to a system optical path of each second laser beam in a laser optical path of each of the mutually separated second laser beams, wherein the divider is an element which divides a first laser beam by diffraction to produce a second laser beam; and wherein the condenser is an element having a focal point on or near the divider, and is arranged in the system optical path in a position where the second laser beams overlap;

and which satisfies the relationship $$f \cdot \{1 - m \cdot \lambda \cdot f/(p \cdot W)\} \leq Zd \leq f \cdot \{1 + m \cdot \lambda \cdot f/(p \cdot W)\}$$

where $\lambda$ represents the wavelength of the first and second laser beams, f represents the focal length of the condenser, m represents the minimum value of the absolute value of the difference of the degree of diffraction of the second laser beams in the same diffraction direction, W represents the beam width of the first laser beam in this diffraction direction, p represents the sequence period of the grating unit of the divider in this diffraction direction, and Zd represents the distance from the condenser to the shaper with the advancing direction of the second laser beam designated positive.

25. A laser irradiation optical system comprising:

a divider that divides a first entering laser beam once, and produces a plurality of second laser beams having beam widths equal to the beam width of the first laser beam and advancing in mutually different directions;

a condenser that condenses each second laser beam to mutually advance in near the same direction; and a shaper that converts the intensity distribution of a cross section perpendicular to a system optical path of each second laser beam in a laser optical path of each of the mutually separated second laser beams, wherein the divider is an element which divides a first laser beam by diffraction to produce a second laser beam; and wherein the condenser is an element having a focal point on or near the divider, and arranged in the system optical path in a position where the second laser beams do not overlap;

and which satisfies the relationship $$f \cdot \{p \cdot W/(m \cdot \lambda \cdot f) - 1\} \leq Zd \leq f \cdot \{1 + m \cdot \lambda \cdot f/(p \cdot W)\}$$

where $\lambda$ represents the wavelength of the first and second laser beams, f represents the focal length of the condenser, m represents the minimum value of the absolute value of the difference of the degree of diffraction of the second laser beams in the same diffraction direction, W represents the beam width of the first laser beam in this diffraction direction, p represents the sequence period of the grating unit of the divider in this diffraction direction, and Zd represents the distance from the condenser to the shaper with the advancing direction of the second laser beam designated positive.

* * * * *